United States Patent

Hasegawa et al.

[11] Patent Number: 5,882,539
[45] Date of Patent: Mar. 16, 1999

[54] WAFER PROCESSING METHOD AND EQUIPMENT THEREFOR

[75] Inventors: Fumihiko Hasegawa; Yasuyoshi Kuroda; Masayuki Yamada, all of Nishi-shirakawa-gun, Japan

[73] Assignee: Shin-Etsu Handotai Co., Ltd., Tokyo, Japan

[21] Appl. No.: 700,604

[22] Filed: Aug. 14, 1996

[30] Foreign Application Priority Data

Aug. 24, 1995 [JP] Japan .................................. 7-239277
Aug. 24, 1995 [JP] Japan .................................. 7-239278
Aug. 24, 1995 [JP] Japan .................................. 7-239279

[51] Int. Cl.⁶ .......................... B24B 1/00; H01L 21/304
[52] U.S. Cl. ............................... 216/88; 216/52; 216/53; 216/89; 156/345; 438/690; 438/691; 438/692; 438/693; 438/906; 438/928; 438/959; 438/974
[58] Field of Search ................................. 216/88, 89, 52, 216/53; 156/636.1, 645.1, 345; 438/690, 691, 692, 693, 906, 928, 959, 974, 977

[56] References Cited

U.S. PATENT DOCUMENTS

| 3,951,728 | 4/1976 | Egashira et al. ........................ 438/747 |
| 4,031,667 | 6/1977 | Sehestedt ................................ 451/258 |
| 4,344,260 | 8/1982 | Ogiwara .................................... 451/44 |
| 4,581,103 | 4/1986 | Levine et al. ............................. 438/63 |
| 4,588,473 | 5/1986 | Hisatomi et al. ........................ 438/460 |
| 5,180,469 | 1/1993 | Abe ........................................... 438/746 |
| 5,225,235 | 7/1993 | Yoshiharu et al. ...................... 438/916 |
| 5,316,620 | 5/1994 | Hasegawa et al. ..................... 438/959 |
| 5,447,890 | 9/1995 | Kato et al. ............................... 438/460 |
| 5,494,862 | 2/1996 | Kato et al. ............................... 438/693 |

FOREIGN PATENT DOCUMENTS

| 0544256 | 6/1993 | European Pat. Off. . |
| 0552989 | 7/1993 | European Pat. Off. . |
| 0617457 | 9/1994 | European Pat. Off. . |
| 0686460 | 12/1995 | European Pat. Off. . |
| 3335116 | 3/1984 | Germany . |

OTHER PUBLICATIONS

"Semiconductor Material Basic Engineering", pubished by Nikkan Kogyo Newspaper Publishing Company, pp. 143–147. (1994).

Primary Examiner—Anthony Green
Attorney, Agent, or Firm—Oliff & Berridge, PLC

[57] ABSTRACT

A wafer processing method which can polish the chamfered portion of a wafer quickly, is disclosed. The processing method comprises the steps of: chamfering a peripheral portion of a wafer obtained by slicing an ingot, by grinding; lapping the wafer; etching the chamfered or lapped wafer; thereafter honing the entirety of the chamfered peripheral portion of the wafer by using a grinding stone while applying a predetermined load to the grinding stone; and thereafter polishing the entirety of the chamfered peripheral portion and the front and rear surfaces of the wafer.

24 Claims, 9 Drawing Sheets

WAFER PROCESSING METHOD AND EQUIPMENT THEREFOR

BACKGROUND OF THE INVENTION

1. Field of the Invention

The present invention relates to a wafer processing method and an equipment therefor, in particular, to a method for finishing the chamfered peripheral portion of a wafer and a finishing equipment therefor.

2. Description of Related Art

Conventionally, a wafer processing method comprising the steps of; chamfering a peripheral portion of a wafer for preventing the peripheral portion from being chipped off, lapping for making variation in thickness of wafers small, etching for removing a cracked layer and contaminated portions which were formed by abrasive grains sticking thereunto or the like, and mirror-polishing the chamfered peripheral portion and the main surface of the wafer, sequentially, is known. A method in which the order of the chamfering and lapping steps is reversed to that of the above-described method, is also known, as described in "Semiconductor Material Basic Engineering" published by Nikkan Kogyo Newspaper Publishing Company on Feb. 28, 1994. However, in the latter method, because the peripheral portion of the wafer remains edged when lapping, there are the danger of occurrence of the peripheral portion being chipped off during lapping and further the danger of the main surface of the wafer being scratched by broken silicon pieces or the like. Therefore, the method comprising a lapping step after a chamfering step, such as the former, is recently on the main stream.

There is another method as a modified example of the former, in which the chamfering step comprises a first grinding step for grinding to round and chamfer the peripheral portion of the wafer by using a grinding stone having large grain size (e.g., #800) and a second grinding step for grinding the chamfered portion by using a grinding stone having small grain size (e.g., #1500) just after the first grinding step. According to the method, the smoothness of the chamfered portion is a little degraded in a following etching step. However, because the smoothness thereof after the etching step is better than the case using only a grinding stone having large grain size, it is possible to easily carry out the work in a following polishing step for the chamfered portion.

However, in a method in which a lapping step is carried out after a chamfering step, there are some problems, that is, because the shape in plan or in section of the chamfered portion is got out of shape, and there is no opportunity to compensate the deformation of the shape, the deformed wafer as it is, is sent to a step for manufacturing semiconductor devices. Consequently, there is a problem that resist material to be removed remains on the peripheral portion of the wafer, in a photo-lithography step, and such a problem has contributed to the prevention of higher integration of semiconductor devices which will be required more and more in the future.

On the other hand, in a conventional etching step which was carried out just after a lapping step, the so-called acid etching, i.e., an etching in which the wafer was immersed in a liquid mixture of hydrofluoric acid, nitric acid and acetic acid, or the like, was carried out. However, because acid etching has defects that it is difficult to keep the flatness of the wafer after lapping and that high costs are required for processing the waste of the used etching liquid, recently, alkali etching, i.e., an etching in which the wafer was immersed in a liquid of sodium hydroxide, a liquid of potassium hydroxide or the like, has been mostly used, instead of acid etching. Because alkali etching is anistropic and is different from acid etching which is isotropic, when alkali etching is utilized, in particular, the rear surface or the periphery of the wafer is roughened, so that the smoothness of the wafer is degraded. Therefore, a further processing for the rear surface or the chamfered portion of the wafer is required. Particularly, there is a problem that the processing for the latter chamfered portion after alkali etching requires much time for processing the surface to have a roughness less than a predetermined value, to obtain the target smoothness, which is several times that of acid etching. When an alkali etching is utilized, in the step of polishing the surfaces of the wafer, a method to improve the smoothness of the rear surface of the wafer, in which a wafer is set on a carrier and the front and rear surfaces of the wafer are simultaneously polished by buffs which are set on lapping plates arranged in upper and lower sides of the wafer, is also carried out. However, in such a polishing for the front and rear surfaces of the wafer, some problems, that is, the chamfered portion of the wafer is shaved by the inner wall of the carrier to make the sectional shape of the chamfered portion get out of shape, and thereby in a photo-lithography step in the following manufacturing process of semiconductor devices, resist material to be removed remains on the peripheral portion of the wafer, may be encountered. Therefore, these problems have contributed to the prevention of higher integration of semiconductor devices.

SUMMARY OF THE INVENTION

The present invention was developed in view of the above-described problems. An object of the present invention is to provide a wafer processing method which can contribute to higher integration of semiconductor devices and can polish the chamfered portion of a wafer quickly.

In accordance with one aspect of the present invention, the processing method comprises the steps of: chamfering a peripheral portion of a wafer obtained by slicing an ingot, by grinding; lapping the wafer; etching the chamfered or lapped wafer; thereafter compensating a deformation in a sectional shape of the chamfered peripheral portion of the wafer, which was generated in the lapping or etching step; and polishing the entirety of the compensated chamfered peripheral portion of the wafer.

According to such a processing method, it is possible to compensate the deformed plan and sectional shapes of the chamfered portion before sending to a step for manufacturing semiconductor devices. Therefore, it is possible to reduce the possibility of resist material being not clearly cut in the step for manufacturing semiconductor devices. In particular, even in the case of the smoothness of the periphery of the wafer being degraded by an alkali etching, the compensating step performed after the etching step can recover or remove the smoothness of the periphery to some extent. Thereby, it is possible to shorten the time required for a following polishing step for the chamfered portion.

The compensating step may comprise a honing step for honing the entirety of the chamfered peripheral portion of the wafer by using a honing stone while applying a predetermined load to the honing stone. Preferably, the lapping step is carried out after the chamfering step, and the wafer processing method further comprises a step for polishing front and rear surfaces of the wafer after the compensating step. Preferably, the lapping step is carried out after the chamfering step, and the wafer processing method further comprises a step for polishing front and rear surfaces of the wafer simultaneously after the etching step and before the compensating step, and a step for polishing the front surface of the wafer after the compensating step. The etching is preferably an alkali etching.

According to the above-described means, because the chamfered peripheral portion of the wafer is honed before polishing the chamfered peripheral portion, it is possible to extremely shorten the time required for processing the surface of the chamfered portion to have a roughness less than a predetermined value, to obtain the target smoothness, and also to set right the sectional shape of the chamfered portion which was got out of shape in a previous step. According to the lapping step being carried out after the chamfering step, it is possible to reduce the danger of occurrence of the peripheral portion being chipped off during lapping and the danger of the main surface of the wafer being scratched by broken silicon pieces.

The compensating step may be carried out by grinding the peripheral chamfered portion of the wafer. Preferably, the lapping step is carried out after the chamfering step, and the wafer processing method further comprises a step for polishing front and rear surfaces of the wafer after the compensating step. The lapping step may be carried out after the chamfering step, and the wafer processing method further may comprise a step for polishing front and rear surfaces of the wafer simultaneously after the etching step and before the compensating step.

According to the above-described method for processing the chamfered portion of a wafer, it is possible to compensate the deformed plan and sectional shapes of the chamfered portion before sending to a step for manufacturing semiconductor devices. Therefore, it is possible to reduce the possibility of resist material to be removed remaining on the peripheral portion of the wafer, in the step for manufacturing semiconductor devices. In particular, even in the case of the smoothness of the periphery of the wafer being degraded by an alkali etching, the grinding performed after the etching step can recover or remove the smoothness of the periphery to some extent. Thereby, it is possible to shorten the time required for following polishing steps for the chamfered portion.

The compensating step may comprise a step of grinding the peripheral chamfered portion of the wafer by a predetermined amount, and a honing step for thereafter honing the entirety of the chamfered peripheral portion of the wafer by using a honing stone while applying a predetermined load to the honing stone. The lapping step is preferably carried out after the chamfering step, and the wafer processing method further comprises a step for polishing front and rear surfaces of the wafer after the compensating step. The lapping step may be carried out after the chamfering step, and the wafer processing method may further comprise a step for polishing front and rear surfaces of the wafer simultaneously after the etching step and before the compensating step, and a step for polishing the front surface of the wafer after the compensating step.

According to the above-described processing method, it is possible to compensate the deformed plan and sectional shapes of the chamfered portion before sending to a step for manufacturing semiconductor devices. Therefore, it is possible to reduce the possibility of resist material to be removed remaining on the peripheral portion of the wafer, in the step for manufacturing semiconductor devices. In particular, even in the case of the smoothness of the periphery of the wafer being degraded by an alkali etching, the grinding and honing steps performed after the etching step can recover or remove the smoothness of the periphery to some extent. Thereby, it is possible to shorten the time required for a following polishing step for the chamfered portion.

In accordance with another aspect of the present invention, the wafer processing equipment comprises; a chamfered portion grinding apparatus for grinding a peripheral chamfered portion of a wafer, and a chamfered portion polishing apparatus for polishing the peripheral chamfered portion ground by the chamfered portion grinding apparatus, continuously.

According to the wafer processing equipment, it is possible to effectively carry out grinding and polishing for the chamfered portion of the wafer.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Figure 1:
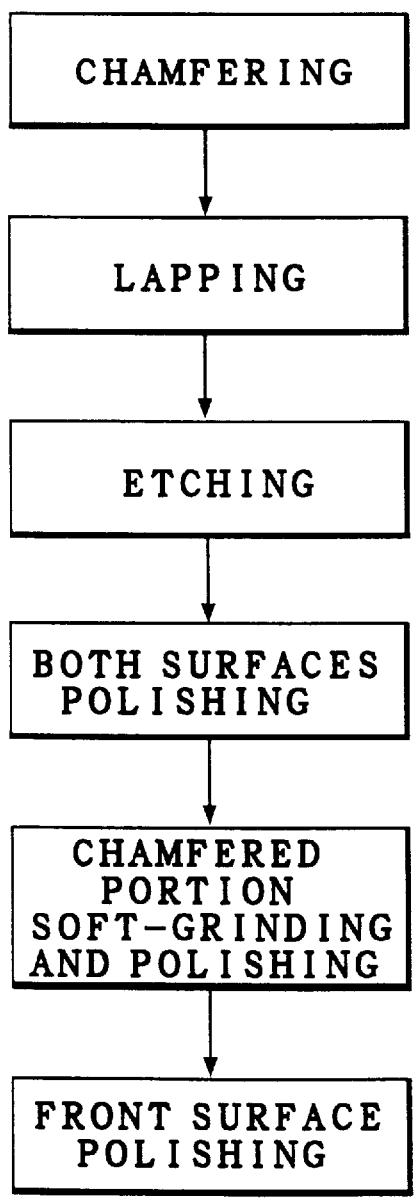
FIG. 1 is a flow diagram showing a first embodiment of the processing method according to the present invention.

FIG. 1 shows the first embodiment of the wafer processing method of the invention. In this embodiment, a chamfered portion honing and polishing steps are adopted for compensating the deformation in a sectional shape of the chamfered peripheral portion of the wafer, which was generated in the preceding step, that is, lapping, etching, or both surfaces polishing steps. As shown in this Figure, the wafer processing method according to the embodiment comprises a chamfering step, a lapping step, an etching step, a both surfaces polishing step, a chamfered portion honing and polishing step, and a front surface polishing step, which are sequentially performed.

(1) Chamfering step

The peripheral portion of a wafer which was obtained by slicing an ingot by using an inner diameter saw slicing machine or a wire saw slicing machine, is ground to round by using a grinding stone while supplying a grinding fluid. The reason for this is that if the peripheral portion of the wafer remains edged, there are the danger of occurrence of the peripheral portion being chipped off during processing or occurrence of Si chips, and such dangers can contribute to the poor performance of an integrated circuit. The grain size of the grinding stone used for the chamfering step is not limited, however, and is preferably about #300 to #800. The bond for the grinding stone in this case is not particularly limited, however, and a metal bond is preferably used.

(2) Lapping step

One or both of the front and rear surfaces of the wafer for which the chamfering step was completed, are lapped by using a slurry containing abrasive grain, e.g., silica ($SiO_2$), zirconia ($ZrO_2$), alumina ($Al_2O_3$) or the like, and an additive such as a fatty acid salt or the like, under a pressure. Although thickness and degree of parallelization of a wafer are determined by cutting the ingot by using the inner diameter saw or the wire saw slicing machine, there are some variations necessarily in practice. This lapping step is for compensating such variations.

(3) Etching step

An etching for the surfaces of the wafer is carried out by immersing the wafer in a liquid of sodium hydroxide, potassium hydroxide or the like. On the surfaces of the obtained wafer to which the lapping step was performed, a cracked layer (a cracked and roughened portions) or contaminated portions (portions into which abrasive grains stick) exist. This etching step is for removing those portions. In order to accomplish the purpose, although not only such an alkali etching but also an acid etching can be used. Preferably, an alkali etching is used to easily keep the flatness of the wafer after lapping and to reduce the cost for processing the waste of the used etching liquid.

(4) Both surfaces polishing step

The wafer is set on a carrier and the front and rear surfaces of the wafer are simultaneously polished by buffs which are set on lapping plates arranged in upper and lower sides of the wafer, while supplying an abrasive liquid. The both surfaces polishing step is for improving the flatness of the wafer extremely and for improving the smoothness of the rear surface to prevent occurrence of Si chips. When an alkali etching was used in the preceding step, the both surfaces polishing step is preferably carried out. On the contrary, when an acid etching was used in the preceding step, the both surfaces polishing step is not essential.

(5) Chamfered portion honing and polishing step

Honing, that is, processing to grind the entirety of the chamfered peripheral portion of the wafer by a honing stone while applying a predetermined load to the honing stone and supplying a grinding fluid, is carried out. This step is for compensating the deformation in a sectional shape of the chamfered peripheral portion of the wafer, which was generated in the preceding step, that is, for improving the smoothness and the sectional shape of the chamfered portion to some extent, which were damaged by the preceding lapping, etching, and both surfaces polishing steps. The bond for the honing stone in this case is not particularly limited, however, a vitrified bond of ceramic raw material system, a metal bond, a resin bond, a metal-resin mixture bond, gum or the like is preferably used. Accordingly, it is possible to improve not only the smoothness of the surfaces but the ability to set right the sectional shape of the chamfered portion which was got out of shape in previous lapping and etching steps. Thereafter, the entirety of the chamfered peripheral portion of the wafer is polished by a buff or the like while supplying an abrasive liquid. This step is for removing residual strain in the just surface layer due to the honing, for preventing generation of chips or fine particles of silicon in the middle of a following step for manufacturing a device by smoothness, and for solving the problem that resist material to be removed remains on the peripheral portion of the wafer, in a photo-lithography step.

(6) Front surface polishing step

The front surface of the wafer is polished by a buff while supplying an abrasive liquid.

Next, a first embodiment of a chamfered portion processing equipment used for the above-described method will be explained.

Figure 2:
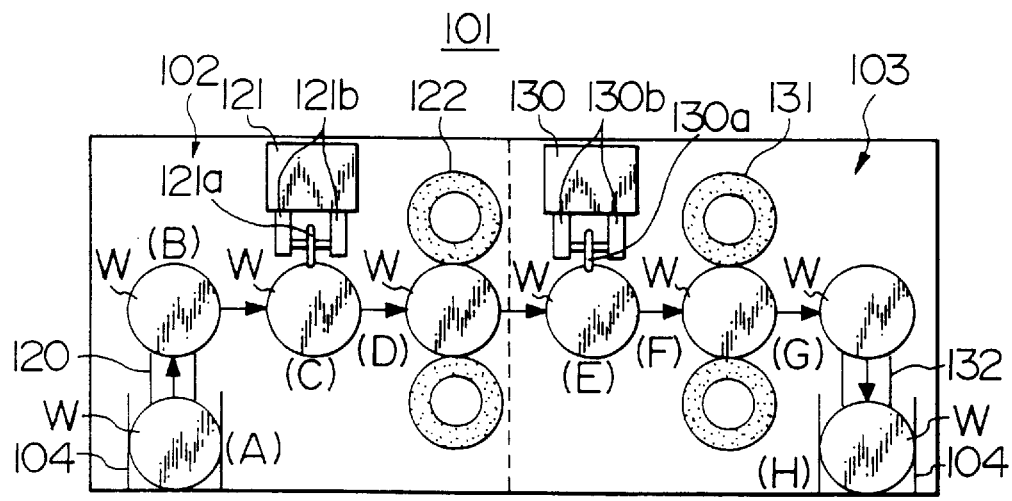
FIG. 2 is a plan view of a first embodiment of the processing equipment according to the present invention.
Figure 3:
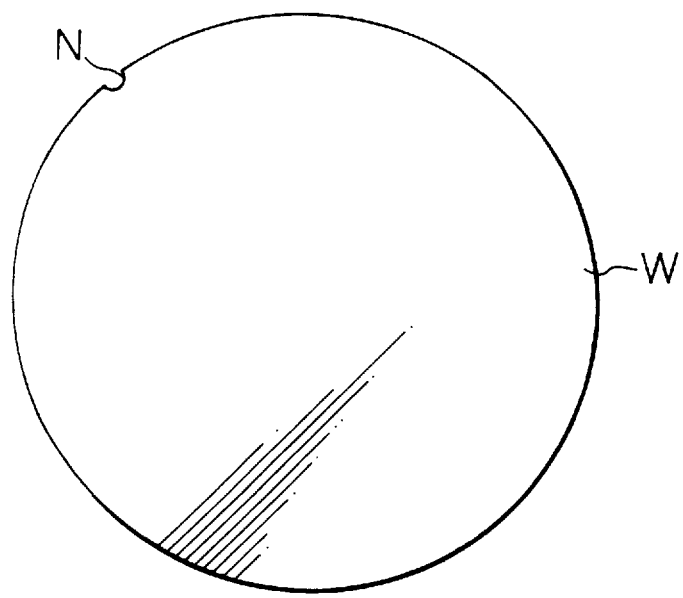
FIG. 3 is a plan view of a wafer with a notch.
Figure 9:
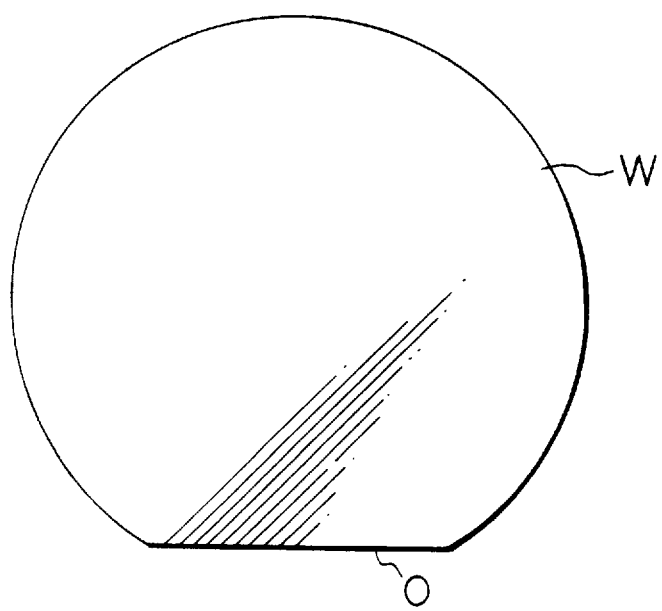
FIG. 9 is a plan view of a wafer with an orientation flat.

In this embodiment, a processing equipment for honing and polishing the chamfered portion of the wafer is shown in FIG. 2. The processing equipment 101 comprises a chamfered portion honing apparatus 102 and a chamfered portion polishing apparatus 103. The processing equipment 101 can carry out honing and polishing, continuously, for the chamfered portion, of a wafer W as shown in FIG. 3, having a notch portion N, or of a wafer W as shown in FIG. 9, having an orientation flat.

The chamfered portion honing apparatus 102 comprises a cassette attachment part (A) for attaching a cassette 104 which contains wafers W, a positioning part (B) for centering the wafer W taken out of the cassette 104 and for positioning the orientation flat or the notch, a notch honing part (C) for honing the notch portion N of the wafer W, and a periphery honing part (D) for honing the peripheral portion except the notch portion N of the wafer w. The chamfered portion polishing apparatus 103 comprises a notch polishing part (E) for polishing the notch portion N of the wafer W, a periphery polishing part (F) for polishing the peripheral portion except the notch portion N of the wafer W, a wafer cleaning part (G), and a cassette attachment part (H) for attaching a cassette 104 to contain wafers W. In the processing apparatus 101, the cassette attachment part (A) has a loader 120, the positioning part (B) has a positioning device which is not shown, the notch honing part (C) has a notch honing device 121, the periphery honing part (D) has a periphery honing device 122, the notch polishing part (E) has a notch polishing device 130, the periphery polishing part (F) has a periphery polishing device 131, the wafer cleaning part (G) has a cleaning device which is not shown, and the cassette attachment part (H) has an unloader 132. In the processing equipment 101, the wafer W is sent to the positioning part (B) by the loader 120. The wafer W which was positioned there is transferred to the notch honing part (C), the periphery honing part (D), the notch polishing part (E), the periphery polishing part (F), and the cleaning part (G), continuously, by a transfer device 140 as shown in FIG. 5, which is provided in the processing equipment 101.

Figure 4:
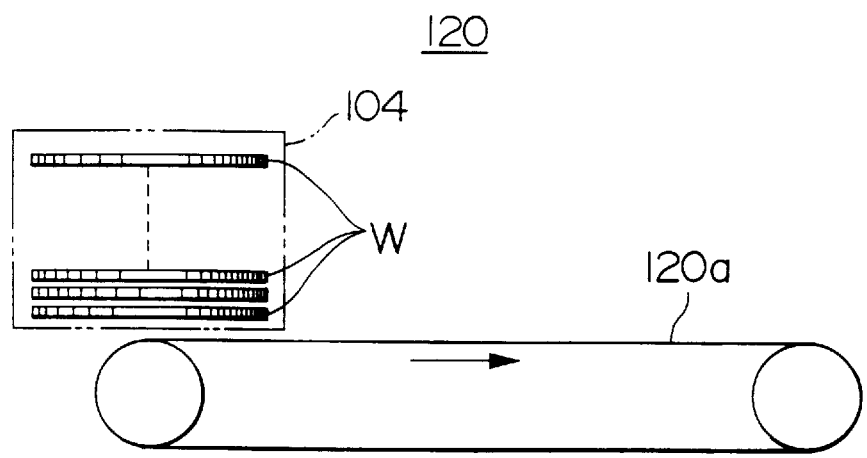
FIG. 4 is a side view of a loader.

The loader 120 comprises a lifting device which is not shown, for lifting up or lowering down the cassette 104 which can hold a lot of wafers W in a stacked state therein, and a belt conveyor 120a for taking the wafer W out of the cassette 104 one by one, as shown in FIG. 4. The loader 120 has a construction in which the wafer W at the bottom position is taken out of the cassette 104 by the belt conveyor 120a in turn and is sent to the positioning part (B).

Figure 5:
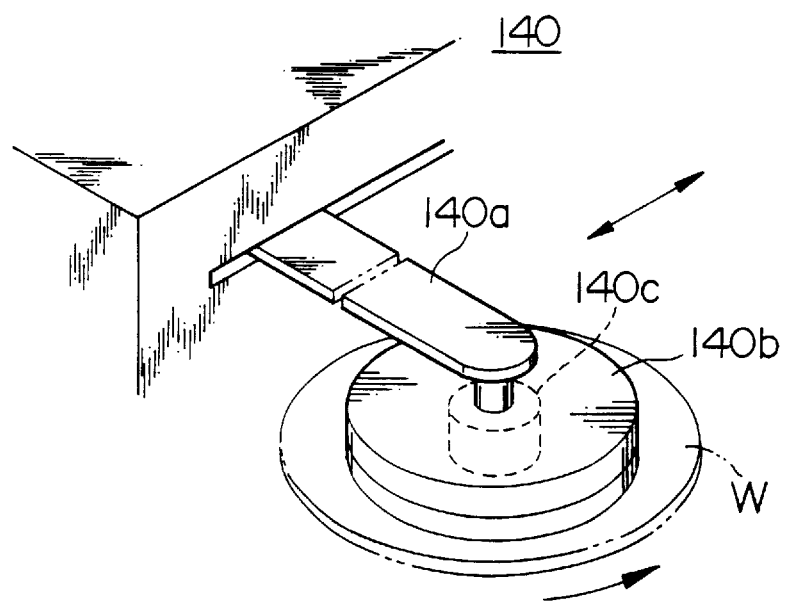
FIG. 5 is a perspective view of a transfer device.

The transfer device 140 is provided with an arm 140a, as shown in FIG. 5, which can be reciprocally moved toward the arrangement of the positioning part (B), the notch honing part (C), the periphery honing part (D), the notch polishing part (E), the periphery polishing part (F), and the wafer cleaning part (G). On the lower side of the top end of the arm 140a, an absorption disc 140b is provided. The absorption disc 140b is communicated with a vacuum pump which is not shown, through an air pipe (not shown), so that a wafer W can be held on the lower surface of the absorption disc 140b by vacuum suction. The absorption disc 140b can be rotated by a motor 140c.

The notch honing device 121 comprises a honing stone 121a, as shown in FIG. 2. The honing stone 121a is supported by a pair of arms 121b and 121b. In the notch honing device 121, the honing stone 121a can be rotated by a motor which is not shown. Honing for the notch portion N of the wafer W is carried out by pressing the periphery of the honing stone 121a against the notch portion N of the wafer W while giving relative reciprocal rotation between the wafer W and the honing stone 121a within a small angle. In order to carry out the honing, the honing stone 121a can come near or separate from the wafer W. During the honing, the honing stone 121a is pressed against the notch portion N of the wafer W with a predetermined load.

Figure 6:
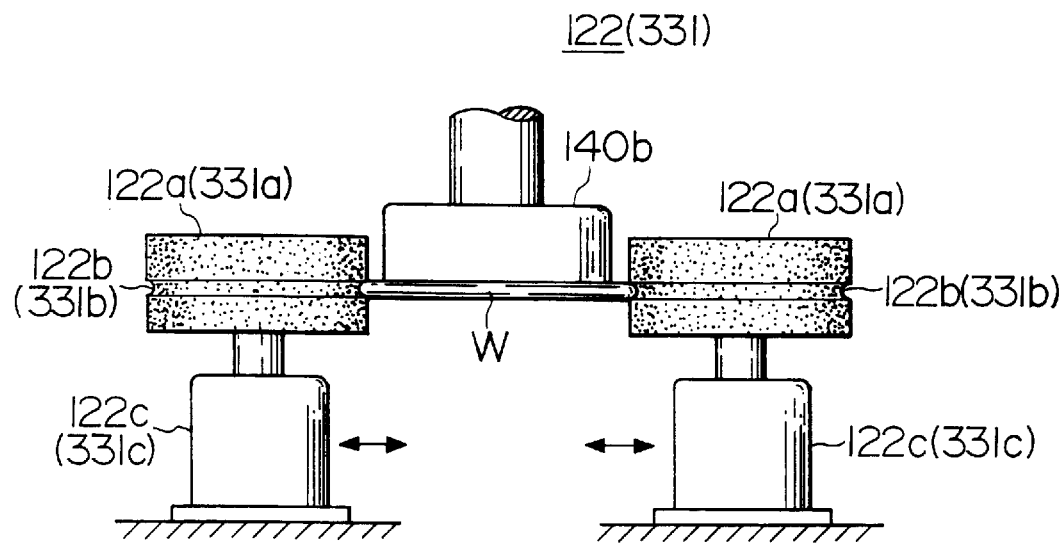
FIG. 6 is a side view of a periphery honing device in the first embodiment of the processing equipment according to the present invention.

The periphery honing device 122 is provided with two cylindrical honing stones 122a, as shown in FIG. 6. On a peripheral surface of each honing stone 122a, a groove 122b which is the so-called form chamfering groove, for receiving the periphery of a wafer W is provided. Each honing stone 122a can be driven to rotate by a motor 122c. In the periphery honing device 122, the periphery of the wafer W is honed by pressing the surface in the groove 122b of the honing stone 122a against the periphery of the wafer W with a predetermined load. The two honing stones 122a can come near or separate from each other and are arranged to sandwich the wafer W therebetween. In this periphery honing device 122, the orientation flat O is also honed.

The notch polishing device 130 comprises a disc-shaped buff 130a made of a foam resin or the like, as shown in FIG. 2. The buff 130a is supported by a pair of arms 130b and 130b. In the notch polishing device 130, the buff 130a can be rotated around the central axis thereof by a motor which is not shown. Polishing for the entirety of the notch portion N of the wafer W is carried out by pressing the periphery of the buff 130a against the notch portion N of the wafer W with a predetermined load while giving relative reciprocal rotation between the wafer and the buff within a small angle.

Figure 7:
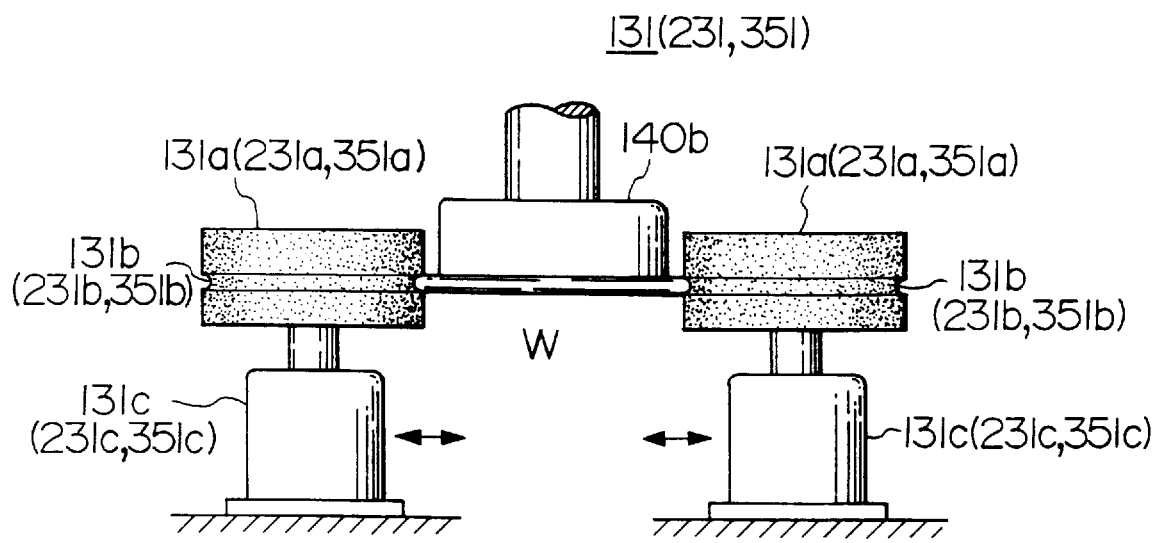
FIG. 7 is a side view of a periphery polishing device in the first embodiment of the processing equipment according to the present invention.

The periphery polishing device 131 comprises two cylindrical buff 131a, as shown in FIG. 7. On the peripheral surface of the buff 131a, a groove 131b which is the so-called form chamfering groove, for receiving the periphery of the wafer W is provided. Each buff 131a can be driven to rotate by a motor 131c. The periphery of the wafer W can be polished by pressing the surface in the buff grooves 131b of the buffs 131a against the periphery of the wafer W with a predetermined load. The two buffs 131a can come near or separate from each other and are arranged to sandwich the wafer W therebetween.

Figure 8:
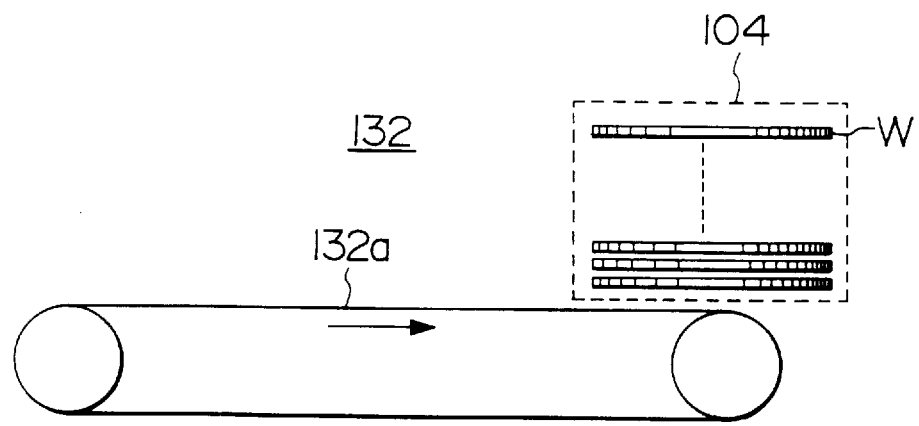
FIG. 8 is a side view of an unloader.

The unloader 132 comprises a lifting device which is not shown, for lifting up or lowering down the cassette 104 which can hold a lot of wafers W in a stacked state therein, and a belt conveyor 132a for putting wafers W into the cassette 104 one by one, as shown in FIG. 8. The unloader 132 has a construction in which the wafers W can be put into the cassette 104 one by one by the belt conveyor 132a and lifted up step by step.

After the polishing of the chamfered portion is completed, the wafer W which has reached to the cleaning part (G) is not positioned again.

According to the first embodiment of the processing method of the invention, because the chamfered peripheral portion of the wafer is honed before polishing the chamfered peripheral portion, it is possible to extremely shorten the time required for processing the surface of the chamfered portion to have a roughness less than a predetermined value, to obtain the target smoothness, and also to set right the sectional shape of the chamfered portion which was got out of shape in a previous step. According to this method, the time required for obtaining a surface of the chamfered portion to have a roughness of about 50 nm in terms of P-V value was only about 20% of that of a method having no honing step.

Figure 10:
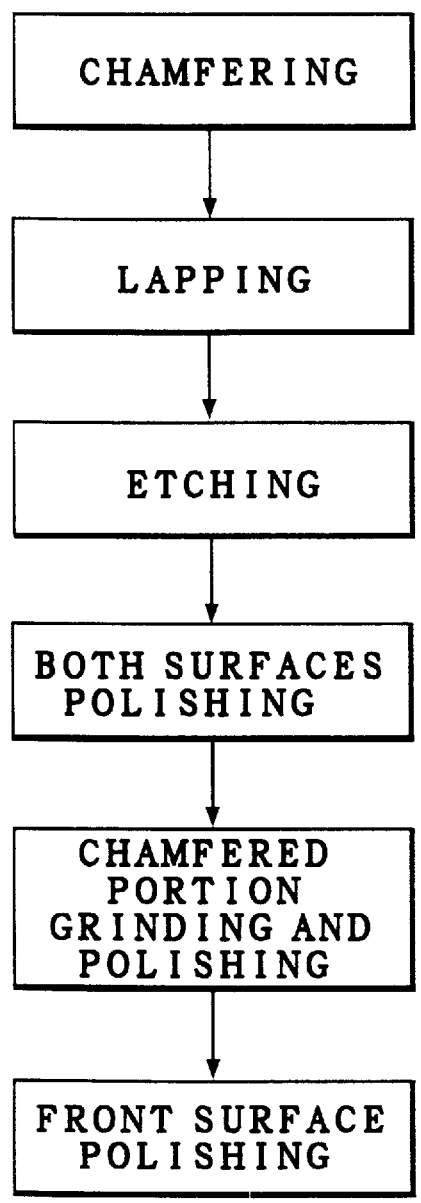
FIG. 10 is a flow diagram showing a second embodiment of the processing method according to the present invention.

FIG. 10 shows a second embodiment of the wafer processing method of the invention. In this embodiment, a chamfered portion grinding and polishing steps are adopted for compensating the deformation in a sectional shape of the chamfered peripheral portion of the wafer, which was generated in the preceding step, that is, lapping, etching, or both surfaces polishing steps.

As shown in FIG. 10, the wafer processing method according to the embodiment comprises a chamfering step, a lapping step, an etching step, a both surfaces polishing step, a chamfered portion grinding and polishing step, and a front surface polishing step, which are sequentially performed.

(1) Chamfering step

The peripheral portion of a wafer which was obtained by slicing an ingot by using an inner diameter saw slicing machine or a wire saw slicing machine, is ground to round by using a grinding stone while supplying a grinding fluid, to form a chamfered portion, similarly to the first embodiment. The grain size of the grinding stone used for the chamfering step is not limited, however, and is preferably about #300 to #800. The term "peripheral portion" means the entirety of the periphery including the notch portion N in case of a wafer W with a notch portion N as shown in FIG. 3, and the entirety of the periphery including an orientation flat in case of a wafer W with an orientation flat as shown in FIG. 9, unless particularly described otherwise.

(2) Lapping step

One or both of the front and rear surfaces of the wafer for which the chamfering step was completed, are lapped by using a slurry containing abrasive grain, e.g., silica ($SiO_2$), zirconia ($ZrO_2$), alumina ($Al_2O_3$) or the like, and an additive such as a fatty acid salt or the like, under a pressure, similarly to the first embodiment.

(3) Etching step

In order to remove a cracked layer (a cracked and roughened portion) or a contaminated portion, the etching for the surfaces of the wafer is carried out by immersing the wafer in a liquid of sodium hydroxide or of potassium hydroxide, similarly to the first embodiment.

(4) Both surfaces polishing step

In order to improve the flatness of the wafer extremely and for improving the smoothness of the rear surface to prevent occurrence of Si chips, the wafer is set on a carrier and the front and rear surfaces of the wafer are simultaneously polished by buffs which are set on lapping plates arranged in upper and lower sides of the wafer, while supplying an abrasive liquid. When an alkali etching was used in the preceding step, the both surfaces polishing step is preferably carried out. On the contrary, when an acid etching was used in the preceding step, the both surfaces polishing step is not essential.

(5) Chamfered portion grinding and polishing step

The peripheral portion except the notch portion N in case of a wafer W with a notch portion N, of the wafer is ground to round again by using a grinding stone. This step is for compensating the plan and sectional shapes of the chamfered portion which were damaged in the preceding lapping and etching steps, to form a predetermined desirable shape again, and for improving the smoothness thereof which was damaged in these steps. The grain size of the grinding stone used for the chamfering step is not limited, however, and is preferably about #1000 to #3000. Thereafter, the peripheral portion of the wafer is polished by using a buff or the like. This step is for removing working damage in the wafer caused by the preceding grinding step, and for preventing generation of chips or fine particles of silicon in the middle of a following step for manufacturing a device by smoothness of the surface.

(6) Front surface polishing step

The front surface of the wafer is polished by a buff while supplying an abrasive liquid.

Next, a second embodiment of a chamfered portion processing equipment used for the above-described method will be explained. In this embodiment, the same numbers are attached to almost the same structural members, elements or the like as those of the first embodiment.

Figure 11:
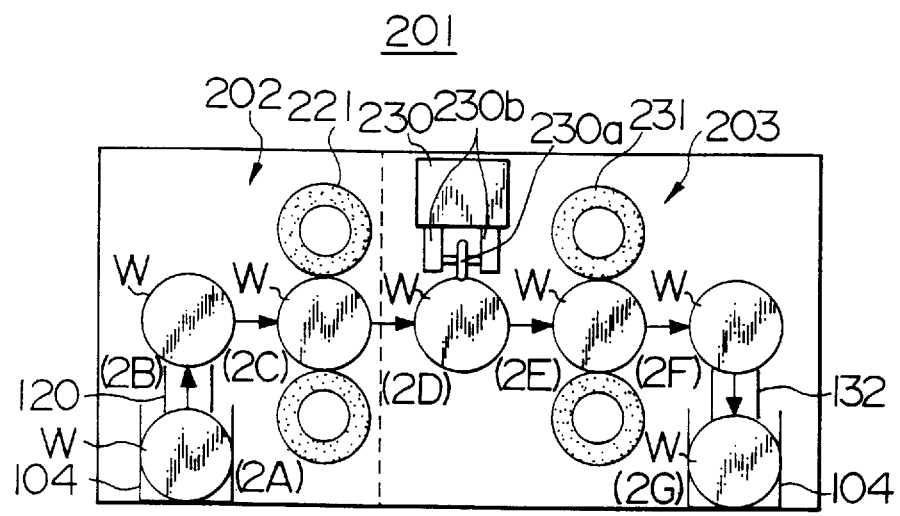
FIG. 11 is a plan view of a second embodiment of the processing equipment according to the present invention.

A second embodiment of a processing equipment for grinding and polishing the chamfered portion of the wafer is shown in FIG. 11. The processing equipment 201 comprises a chamfered portion grinding apparatus 202 and a chamfered portion polishing apparatus 203, and can carry out grinding and polishing, for the chamfered portion, of the wafer W, continuously.

The chamfered portion grinding apparatus 202 comprises a cassette attachment part (2A) for attaching a cassette 104 which contains wafers W, a positioning part (2B) for centering the wafer W taken out of the cassette 104 and for positioning the orientation flat or the notch, and a periphery grinding part (2C) for grinding the peripheral portion except the notch portion N of the wafer W. The chamfered portion polishing apparatus 203 comprises a notch polishing part (2D) for polishing the notch portion N of the wafer W, a periphery polishing part (2E) for polishing the peripheral portion except the notch portion N of the wafer W, a cleaning part (2F) for cleaning the wafer W, and a cassette attachment part (2G) for attaching a cassette 104 to contain wafers W. In the processing apparatus 201, the cassette attachment part (2A) has a loader 120, the positioning part (2B) has a positioning device which is not shown, the periphery grinding part (2C) has a periphery grinding device 221, the notch polishing part (2D) has a notch polishing device 130, the periphery polishing part (2E) has a periphery polishing device 231, the cleaning part (2F) has a cleaning device which is not shown, and the cassette attachment part (2G) has an unloader 132. In the processing equipment 201, the wafer W is sent to the positioning part (2B) by the loader 120. The wafer W which was positioned there is transferred to the periphery grinding part (2C), the notch polishing part (2D), the periphery polishing part (2E), and the cleaning part (2F), by a transfer device 140 as shown in FIG. 5, which is provided in the processing equipment 201.

Similarly to the first embodiment, the loader 120 comprises a lifting device for lifting up or lowering down the cassette 104 which can hold a lot of wafers W in a stacked state therein, and a belt conveyor 120a for taking the wafer W out of the cassette 104 one by one, as shown in FIG. 4. The loader 220 has a construction in which the wafer W at the bottom position is taken out of the cassette 204 by the belt conveyor 220a in turn and is sent to the positioning part (2B).

The transfer device 140 is provided with an arm 140a, as shown in FIG. 5, which can be reciprocally moved toward the arrangement of the positioning part (2B), the periphery grinding part (2C), the notch polishing part (2D), the periphery polishing part (2E), and the cleaning part (2F). On the lower side of the top end of the arm 140a, an absorption disc 140b is provided to held a wafer W on the lower surface thereof by vacuum suction, similarly to the first embodiment. The absorption disc 140b can be rotated by a motor 140c.

Figure 12:
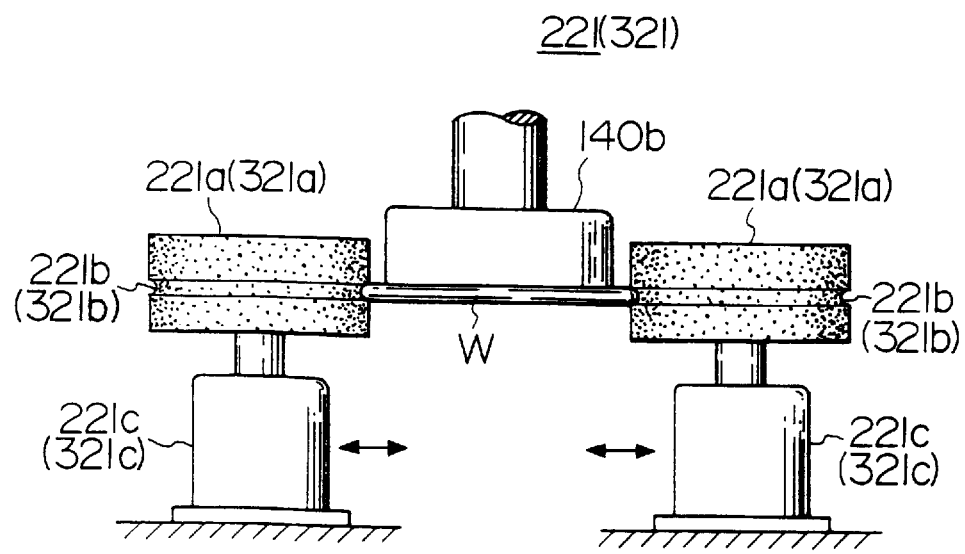
FIG. 12 is a side view of a periphery grinding device in the second embodiment of the processing equipment according to the present invention.

The periphery grinding device 221 is provided with two cylindrical grinding stones 221a and 221a, as shown in FIG. 12. On a peripheral surface of each grinding stone 221a, a groove 221b which is the so-called form chamfering groove, for receiving the periphery of a wafer W is provided. Each grinding stone 221a can be driven to rotate by a motor 221c. In the periphery grinding device 221, the periphery of a wafer W is ground to a predetermined amount or to form a predetermined desirable shape, by pressing the surface in the groove 221b of each grinding stone 221a against the periphery of the wafer W. The grinding stones 221a and 221a can come near or separate from each other and are arranged to sandwich the wafer W therebetween.

The notch polishing device 230 comprises a disc-shaped buff 230a made of a foam resin, similarly to the first embodiment. In the notch polishing device 230, the buff 230a can be rotated by a motor, and polishing for the entirety of the notch portion N of the wafer W is carried out by pressing the periphery of the buff 230a against the notch portion N of the wafer W while giving relative reciprocal rotation between the wafer W and the buff 230a within a small angle.

As shown in FIG. 7, the periphery polishing device 231 comprises two cylindrical buffs 231a made of a foam plastic, similarly to the first embodiment. On a peripheral surface of the buff 231a, a form chamfering groove 231b for receiving the periphery of the wafer W is provided. The periphery of the wafer W can be polished by pressing the surface in the buff grooves 231b and 231b of the buffs 231a and 231a against the periphery of the wafer W with a predetermined load. The two buffs 231a and 231a can come near or separate from each other and can sandwich the wafer W therebetween.

An unloader 132 similar to that of the first embodiment is provided, as shown in FIG. 8, in this embodiment. The unloader 132 has a construction in which the wafers W can be put into the cassette 104 one by one by the belt conveyor 132a and lifted up step by step.

After the polishing of the chamfered portion is completed, the wafer W which has reached to the cleaning part (2F) is not positioned again.

According to the second embodiment of the processing method of the invention, it is possible to compensate the deformed plan and sectional shapes of the chamfered portion before sending to a step for manufacturing semiconductor devices. Therefore, it is possible to reduce the possibility of resist material to be removed remaining on the peripheral portion of the wafer in the step for manufacturing semiconductor devices. In particular, even in the case of the smoothness of the periphery of the wafer being degraded by an alkali etching, the grinding performed after the etching step can recover or remove the smoothness of the periphery to some extent. Thereby, it is possible to shorten the time required for the following polishing step for the chamfered portion.

According to the second embodiment of the processing equipment of the invention, it is possible to effectively carry out grinding and polishing for the chamfered portion of the wafer W.

Figure 13:
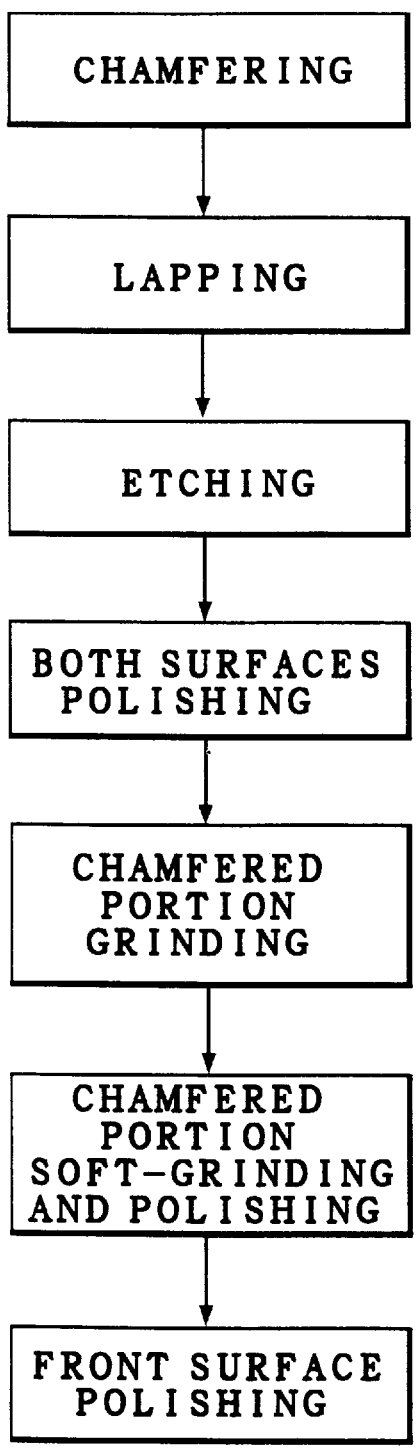
FIG. 13 is a flow diagram showing a third embodiment of the processing method according to the present invention.

FIG. 13 shows a third embodiment of the wafer processing method of the invention. In this embodiment, a chamfered portion grinding step and chamfered portion honing and polishing steps are adopted for compensating the deformation in a sectional shape of the chamfered peripheral portion of the wafer, which was generated in the preceding step, that is, lapping, etching, or both surfaces polishing steps.

FIG. 13 shows a third embodiment of the wafer processing method of the invention. As shown in this Figure, the wafer processing method according to the embodiment comprises a chamfering step, a lapping step, an etching step, a both surfaces polishing step, a chamfered portion grinding step, a chamfered portion honing and polishing step, and a front surface polishing step, which are sequentially performed. Each step is carried out as follows.

The chamfering step, the lapping step, the etching step, and the both surfaces polishing step were carried out in almost the same manner as those of the second embodiment.

(1) Chamfering step

That is, the peripheral portion of a wafer which is obtained by slicing an ingot by using an inner diameter saw slicing machine or a wire saw slicing machine, is ground to round by using a grinding stone while supplying a grinding fluid, to form a chamfered portion. The grain size of the grinding stone used for the chamfering step is about #300 to #800.

(2) Lapping step

One or both of the front and rear surfaces of the wafer for which the chamfering step was completed, are lapped by using a slurry containing abrasive grain, e.g., silica ($SiO_2$), zirconia ($ZrO_2$), alumina ($Al_2O_3$) or the like, and an additive such as a fatty acid salt or the like, under a pressure.

(3) Etching step

The etching for the surfaces of the wafer is carried out by immersing the wafer in a liquid of sodium hydroxide or of potassium hydroxide.

(4) Both surfaces polishing step

The wafer is set on a carrier and the front and rear surfaces of the wafer are simultaneously polished by buffs which are set on lapping plates arranged in upper and lower sides of the wafer, while supplying an abrasive liquid. When an alkali etching was used in the preceding step, the both surfaces polishing step is preferably carried out. On the contrary, when an acid etching was used in the preceding step, the both surfaces polishing step is not essential.

(5) Chamfered portion grinding step

The chamfered peripheral portion of the wafer is ground to round again by using a grinding stone while supplying a grinding fluid. This step is for compensating the plan and sectional shapes of the chamfered portion which were damaged in the preceding lapping and etching steps, and for recovering or improving the smoothness thereof which was damaged in these steps. The grain size of the grinding stone used for the chamfering step is not limited, however, and is preferably about #1000 to #3000. In this case, grinding for the chamfered portion of the notch portion N may not be necessarily carried out because the notch portion N is small and the deformation thereof is also small. Although grinding for the chamfered portion of the notch portion N may be carried out, of course, it takes much time to grind.

(6) Chamfered portion honing and polishing step

Honing, that is, processing to grind the notch portion of the wafer by a honing stone while applying a predetermined load to the honing stone and supplying a grinding fluid, is carried out. This step is for improving the smoothness of the notch chamfered portion to some extent which was damaged in the etching step. Thereafter, similarly, honing is carried out to also the chamfered peripheral portion of the wafer, by grinding the entirety of the portion of the wafer by a honing stone while applying a predetermined load to the honing stone and supplying a grinding fluid. This step is for improving the smoothness of the chamfered portion which has an appropriate shape compensated by the preceding chamfered portion grinding step. The grain size of the grinding stone used for each honing step is not limited, however, is preferably about #2000 to #5000. The bond for the honing stone in each honing step is not either particularly limited, however, and a vitrified bond of ceramic raw material system, a metal bond, a resin bond, a metal-resin mixture bond, or gum is preferably used. Accordingly, it is possible to improve not only the smoothness of the surfaces but the ability to set right the sectional shape of the chamfered portion which was got out of shape in previous lapping and etching steps. Thereafter, the chamfered peripheral portion of the wafer is polished by a buff or the like while supplying an abrasive liquid. This step is for removing residual strain in the surface layer caused by the preceding grinding step or honing step, and for preventing generation of chips or fine particles of silicon in the middle of following step for manufacturing a device.

(7) Front surface polishing step

The front surface of the wafer is polished by a buff while supplying an abrasive liquid.

Next, a third embodiment of a chamfered portion processing equipment used for the above-described method will be explained.

Figure 14:
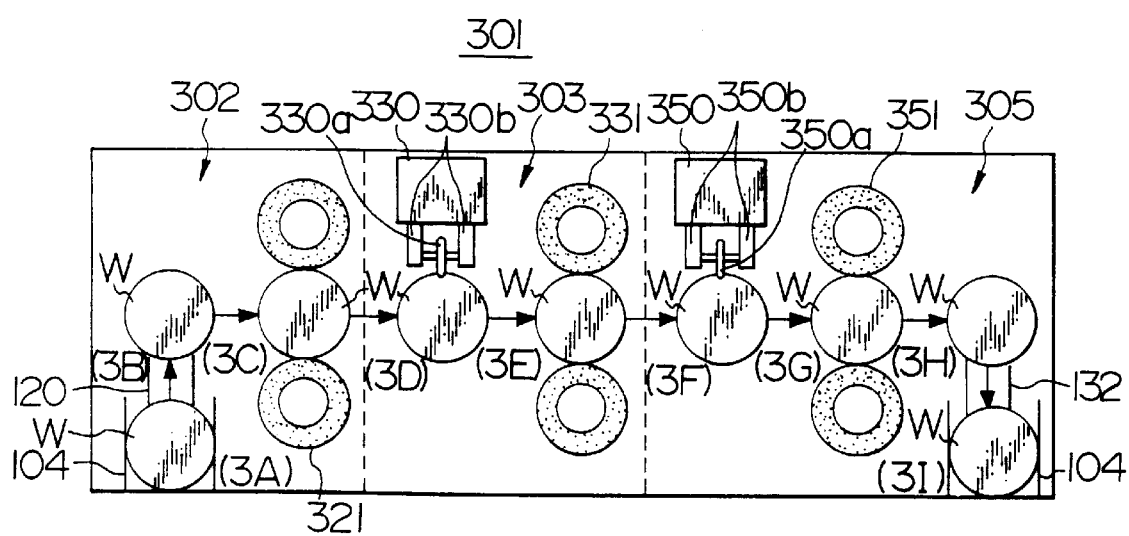
FIG. 14 is a plan view of a third embodiment of the processing equipment according to the present invention.

The processing equipment for honing and polishing the chamfered portion of the wafer is shown in FIG. 14. In this Figure, the processing equipment 301 comprises a chamfered portion grinding apparatus 302, a chamfered portion honing apparatus 303, and a chamfered portion polishing apparatus 305, and can carry out grinding, honing and polishing, for the chamfered portion, of the wafer W as shown in FIG. 3, having a notch portion N, or of a wafer W as shown in FIG. 9, having an orientation flat, continuously.

The chamfered portion grinding apparatus 302 comprises a cassette attachment part (3A) for attaching a cassette 104 which contains wafers W, a positioning part (3B) for centering the wafer W taken out of the cassette 104 and for positioning the orientation flat or the notch, and a periphery grinding part (3C) for grinding the peripheral portion except the notch portion N of the wafer W. The chamfered portion honing apparatus 303 comprises a notch honing part (3D) for honing the notch portion N of the wafer W, a periphery honing part (3E) for honing the peripheral portion except the notch portion N of the wafer W. The chamfered portion polishing apparatus 305 comprises a notch polishing part (3F) for polishing the notch portion N of the wafer W, a periphery polishing part (3G) for polishing the peripheral portion except the notch portion N of the wafer W, a cleaning part (3H) for cleaning the wafer W, and a cassette attachment part (3I) for attaching a cassette 104 to contain wafers W. In the processing apparatus 301, the cassette attachment part (3A) has a loader 120, the positioning part (3B) has a positioning device which is not shown, the periphery grinding part (3C) has a periphery grinding device 321, the notch honing part (3D) has a notch honing device 330, the periphery honing part (3E) has a periphery honing device 331, the notch polishing part (3F) has a notch polishing device 350, the periphery polishing part (3G) has a periphery polishing device 351, the cleaning part (3H) has a cleaning device which is not shown, and the cassette attachment part (3I) has an unloader 132. In the processing equipment 301, the wafer W is sent to the positioning part (3B) by the loader 120. The wafer W which was centered and positioned there is transferred to the periphery grinding part (3C), the notch honing part (3D), the periphery honing part (3E), the notch polishing part (3F), the periphery polishing part (3G), and the cleaning part (3H), by a transfer device 140 which is shown in FIG. 5 and is provided in the processing equipment 301.

The loader 120 has almost the same structure as that of the first embodiment, as shown in FIG. 4. The loader 120 can lift up or lower down the cassette 104 which can hold a lot of wafers W in a stacked state therein, and can take the wafer W out of the cassette 104 one by one and transfer the wafer W to the positioning part (3B), by the belt conveyor 120a.

The transfer device 140 has almost the same structure as that of the first embodiment. The transfer device 140 is provided with an arm 140a, as shown in FIG. 5, which can be reciprocally moved to the arrangement of the positioning part (3B), the periphery grinding part (3C), the notch honing part (3D), the periphery honing part (3E), the notch polishing part (3F), the periphery polishing part (3G), and the cleaning part (3H). On the lower side of the top end of the arm 140a, an absorption disc 140b is provided to held a wafer W on the lower surface thereof by vacuum suction, similarly to the first embodiment. The absorption disc 140b can be rotated by a motor 140c.

The periphery grinding device 321 is provided with two cylindrical grinding stones 321a and 321a, as shown in FIG. 12. On a peripheral surface of each grinding stone 321a, a groove 321b which is the so-called form chamfering groove, for receiving the periphery of a wafer W is provided. Each grinding stone 321a can be driven to rotate, by a motor 321c. In the periphery grinding device 321, the periphery of a wafer W is ground to a predetermined amount by pressing the surface in the groove 321b of each grinding stone 321a against the periphery of the wafer W while both of the grinding stones 321a are rotated at a high rotating speed and the wafer W is rotated at a low rotating speed. The grinding stones 321a and 321a are provided so that the honing stones can come near or separate from each other and can sandwich the wafer W therebetween. The periphery grinding device 321 can grind also the orientation flat O of the wafer W.

The notch honing device 330 comprises a disc-shaped honing stone 330a similar to the grinding stone 121a in the first embodiment, as shown in FIG. 14. The honing stone 330a is supported by a pair of arms 330b and 330b. In the notch honing device 330, honing for the notch portion N of the wafer W is carried out by pressing the periphery of the honing stone 330a against the notch portion N of the wafer W while rotating the honing stone 330a at a high rotating speed by a motor which is not shown and while giving relative reciprocal rotation between the wafer W and the honing stone 330a within a small angle. In order to carry out such a honing, the honing stone 330a can come near or separate from the wafer W. During the honing, the honing stone 330a is pressed against the notch portion N of the wafer W with a predetermined load.

The periphery honing device 331 is provided with two cylindrical honing stones 331a and 331a, similar to the periphery honing device 122 in the first embodiment, as shown in FIG. 6. On a peripheral surface of each honing stone 331a, a groove 331b which is the so-called form chamfering groove, for receiving the periphery of a wafer W is provided. Each honing stone 331a can be driven to rotate by a motor 331c. In the periphery honing device 331, the periphery of a wafer W is honed by pressing the surface in the groove 331b of the honing stone 331a against the periphery of the wafer W with a predetermined load while rotating the honing stone 331a at a high rotating speed by a motor which is not shown and rotating the wafer W at a low rotating speed. The honing stones 331a and 331a have a construction so that the honing stones can come near or separate from each other and can sandwich the wafer W therebetween. In this periphery honing device 331, the orientation flat O is also honed.

The notch polishing device 350 has almost the same construction as the notch polishing device 130 in the first embodiment. That is, the notch polishing device 350 comprises a disc-shaped buff 350a made of a foam resin, as shown in FIG. 14. The buff 350a is supported by a pair of arms 350b and 350b. In the notch polishing device 350, the buff 350a can be rotated by a motor which is not shown. Polishing for the notch portion N of the wafer W is carried out by pressing the periphery of the buff 350a against the notch portion N of the wafer W with a predetermined load while giving relative reciprocal rotation between the wafer W and the buff 350a within a small angle.

The periphery polishing device 351 comprises two cylindrical buffs 351a, as shown in FIG. 7. On a peripheral surface of the buff 351a, a groove 351b which is the so-called form chamfering groove, for receiving the periphery of the wafer W is provided. Each buff 351a can be driven to rotate by a motor 351c. The periphery of the wafer W can be polished by pressing the surface in the buff grooves 351b of the buffs 351a against the periphery of the wafer W with a predetermined load while rotating the buffs 351a and 351a at a high rotating speed and rotating the wafer W at a low rotating speed. Both buffs 351a have a construction so that the buffs can come near or separate from each other and can sandwich the wafer W therebetween. In this periphery polishing device 351, the orientation flat O is also polished.

The unloader 132 has almost the same structure and function as that of the first embodiment.

After the polishing of the chamfered portion was completed, the wafer W which has reached to the cleaning part (3H) is not positioned again.

According to the third embodiment of the processing method of the invention, because the chamfered peripheral portion of the wafer is ground and honed before polishing the chamfered peripheral portion, it is possible to extremely shorten the time required for processing the surface of the chamfered portion to have a roughness less than a predetermined value, to obtain the target smoothness, and also to set right the sectional shape of the chamfered portion which was got out of shape in a previous step.

According to the third embodiment of the processing equipment of the invention, it is possible to effectively carry out grinding, honing and polishing for the chamfered portion of the wafer W.

What is claimed is:

1. A wafer processing method comprising the steps of:
   chamfering a peripheral portion of a wafer by grinding;
   lapping the wafer before or after the chamfering step;
   etching the chamfered and lapped wafer;
   subsequently honing a deformation in a sectional shape of an etched peripheral portion of the wafer, the deformation being generated in the lapping or etching step; and
   polishing an entirety of the honed and etched peripheral portion of the wafer.

2. A wafer processing method as claimed in claim 1, wherein the honing step comprises honing the entirety of the peripheral portion of the wafer using a honing stone while applying a load to the honing stone.

3. A wafer processing method as claimed in claim 2, wherein the lapping step is performed after the chamfering step, and further comprising the step of polishing front and rear surfaces of the wafer after the honing step.

4. A wafer processing method as claimed in claim 2, wherein the honing step comprises a notch honing step for honing a notch portion of the wafer, and a periphery honing step for honing the peripheral portion of the wafer.

5. A wafer processing method as claimed in claim 4, wherein the step of notch honing comprises pressing a periphery of a rotating disc-shaped honing stone against the notch portion of the wafer with a load while a relative reciprocal rotation within a small angle is given to the wafer with respect to the honing stone.

6. A wafer processing method as claimed in claim 4, wherein the periphery honing step comprises pressing a surface in a groove having a form substantially matching a form of the peripheral portion of the wafer to be honed against the periphery of the wafer, the groove being formed on a periphery of a cylindrical honing stone, and the groove being pressed against the periphery of the wafer with a load.

7. A wafer processing method as claimed in claim 4, wherein the periphery honing step comprises pressing a surface in a groove having a form substantially matching a form of the peripheral portion of the wafer to be honed against the periphery of the wafer, the groove being formed on each periphery of two cylindrical honing stones sandwiching the wafer, and the groove being pressed against the periphery of the wafer with a load.

8. A wafer processing method as claimed in claim 2, wherein the honing step comprises a periphery honing step for honing the peripheral portion of the wafer and an orientation flat of the wafer.

9. A wafer processing method as claimed in claim 2, wherein a bond for bonding abrasive grains of the honing stone comprises at least one bond selected from the group consisting of a vitrified bond of ceramic raw material system, a metal bond, a resin bond, a metal-resin mixture bond, and gum.

10. A wafer processing method as claimed in claim 2, wherein the lapping step is performed after the chamfering step, and the wafer processing method further comprises the steps of:
    polishing front and rear surfaces of the wafer simultaneously after the etching step and before the honing step; and
    polishing the front surface of the wafer after polishing the entirety of the honed peripheral portion.

11. A wafer processing method as claimed in claim 2, wherein the etching is an alkali etching.

12. A wafer processing method comprising the steps of:
    chamfering a peripheral portion of a wafer by grinding;
    lapping the wafer before or after the chamfering step;
    etching the chamfered and lapped wafer;
    subsequently grinding a deformation in a sectional shape of the etched peripheral portion of the wafer, the deformation being generated in the lapping or etching step; and
    polishing an entirety of the ground peripheral portion of the wafer.

13. A wafer processing method as claimed in claim 12, wherein the lapping step is performed after the chamfering step, and further comprising the step of polishing front and rear surfaces of the wafer after the grinding step.

14. A wafer processing method as claimed in claim 12, wherein the lapping step is performed after the chamfering step, and further comprising the step of polishing front and rear surfaces of the wafer simultaneously after the etching step and before the grinding step.

15. A wafer processing method as claimed in claim 12, wherein the etching is an alkali etching.

16. A wafer processing method as claimed in claim 12, wherein the grinding step comprises grinding the peripheral portion of the wafer, and further comprising the step of subsequently honing the entirety of the peripheral portion of the wafer using a honing stone while applying a load to the honing stone.

17. A wafer processing method as claimed in claim 16, wherein the lapping step is performed after the chamfering step, and further comprising the step of polishing front and rear surfaces of the wafer after the honing step.

18. A wafer processing method as claimed in claim 16, wherein the lapping step is performed after the chamfering step, and further comprising the step of polishing front and rear surfaces of the wafer simultaneously after the etching step and before the honing step, and the step of polishing the front surface of the wafer after the grinding step.

19. A wafer processing method as claimed in claim 16, wherein the etching is an alkali etching.

20. A wafer processing equipment comprising:
    a grinding apparatus for grinding a peripheral portion of a wafer; and
    a polishing apparatus for continuously polishing the peripheral portion of the wafer ground by the grinding apparatus.

21. A wafer processing equipment as claimed in claim 20, wherein the grinding apparatus comprises a honing apparatus for honing the peripheral portion of the wafer, and the honing apparatus comprises a honing stone for honing the peripheral portion while applying a load to the honing stone.

22. A wafer processing equipment as claimed in claim 21, wherein:
    the honing apparatus further comprises:
        a notch honing part for honing a notch portion of the wafer; and
        a periphery honing part for honing the peripheral portion of the wafer; and
    the polishing apparatus comprises:
        a notch polishing part for polishing the notch portion of the wafer; and
        a periphery polishing part for polishing the peripheral portion of the wafer.

23. A wafer processing equipment as claimed in claim 20, wherein the grinding apparatus comprises a periphery grinding part for grinding the peripheral portion of the wafer; and
    the polishing apparatus comprises:
        a notch polishing part for polishing the notch portion of the wafer; and
        a periphery polishing part for polishing the peripheral portion of the wafer.

24. A wafer processing equipment as claimed in claim 20, wherein:
    the grinding apparatus comprises:
        a periphery grinding part for grinding the peripheral portion of the wafer;
        a notch honing part for honing the notch portion of the wafer; and
        a periphery honing part for honing the peripheral portion of the wafer; and
    the polishing apparatus comprises:
        a notch portion polishing part for polishing the notch portion of the wafer; and
        a periphery polishing part for polishing the peripheral portion of the wafer.

* * * * *